United States Patent [19]

Sellers

[11] Patent Number: 5,584,974
[45] Date of Patent: Dec. 17, 1996

[54] ARC CONTROL AND SWITCHING ELEMENT PROTECTION FOR PULSED DC CATHODE SPUTTERING POWER SUPPLY

[75] Inventor: Jeff C. Sellers, Palmyra, N.Y.

[73] Assignee: ENI, Rochester, N.Y.

[21] Appl. No.: 545,916

[22] Filed: Oct. 20, 1995

[51] Int. Cl.$^6$ ................................................ C23C 14/54
[52] U.S. Cl. .................. 204/192.13; 204/192.12; 204/298.03; 204/298.08
[58] Field of Search .................. 204/192.12, 192.13, 204/298.08, 298.03

[56] References Cited

U.S. PATENT DOCUMENTS

| | | | |
|---|---|---|---|
| 4,610,775 | 9/1986 | Phifer | 204/192.12 |
| 4,693,805 | 9/1987 | Quazi | 204/192.22 |
| 4,963,238 | 10/1990 | Siefkes et al. | 204/192.12 |
| 5,009,764 | 4/1991 | Siefkes et al. | 204/298.08 |
| 5,192,894 | 3/1993 | Teschner | 315/111.21 |
| 5,241,152 | 8/1993 | Anderson et al. | 219/121.57 |
| 5,281,321 | 1/1994 | Stümer et al. | 204/298.08 |
| 5,286,360 | 2/1994 | Szczyrbowski et al. | 204/298.08 |
| 5,427,669 | 6/1995 | Drummond | 204/298.08 |
| 5,507,930 | 4/1996 | Yamashita et al. | 204/192.15 |

FOREIGN PATENT DOCUMENTS

| | | | |
|---|---|---|---|
| 0553410 | 8/1993 | European Pat. Off. | 204/298.08 |
| 3121389 | 8/1982 | Germany | 204/298.08 |
| 2422808 | 11/1985 | Germany | 204/298.08 |
| 4127505 | 2/1993 | Germany | 204/298.08 |
| 57-69324 | 4/1982 | Japan | 204/298.08 |
| 6-145973 | 5/1994 | Japan | 204/298.08 |
| 1134562 | 11/1968 | United Kingdom | 204/298.08 |
| 2045553 | 10/1980 | United Kingdom | 204/298.08 |

OTHER PUBLICATIONS

L. Anderson, "A New Technique For Arc Control In DC Sputtering", *Society of Vacuum Coaters 35th Annual Conference Proceedings* (1992) pp. 325–329.

*Primary Examiner*—Aaron Weisstuch
*Attorney, Agent, or Firm*—Trapani & Molldrem

[57] ABSTRACT

A dc sputtering process applies a pulsating dc voltage in which each cycle includes a pulse portion of negative dc voltage of −300 to −700 volts alternating with a reverse bias (positive) pulse of about +50 to +300 volts. The reverse bias pulse portion will reduce or eliminate sources for arcing in most cases. To combat sticky or persistent arcing, the negative pulse portion is monitored. If, during a window portion of the negative pulse portion, the applied voltage drops into a range characteristic of arcing for two successive cycles, then the applied power is interrupted for a period, e.g., 200 microseconds, and reverse bias is applied. An overvoltage detection and clamping circuit monitors the applied voltage for extreme voltage excursions, and if an overvoltage threshold is exceeded for two successive cycles, the applied power is interrupted. The overvoltage detection and clamping circuit can comprise a string of zener diodes or equivalent voltage limiting devices connected to the applied voltage. This circuit absorbs the voltage excursions beyond the threshold and protects the power supply and the substrate in the plasma chamber.

9 Claims, 3 Drawing Sheets

1

ARC CONTROL AND SWITCHING ELEMENT PROTECTION FOR PULSED DC CATHODE SPUTTERING POWER SUPPLY

BACKGROUND OF THE INVENTION

This invention relates to the deposition of thin films and is more particularly concerned with a reactive sputtering process wherein atoms of a target material are freed from a conductive target to form a coating which is deposited on a substrate. This process can be employed, for example, in a reactive sputtering process, for creating dielectric insulating layers on electrical parts, or wear-resistant layers on mechanical parts.

The invention is more specifically directed to an improved dc sputtering process in which the dielectric coating material that becomes lodged on the conductive target is removed, thus avoiding a major cause of arcing.

Reactive sputtering, and problems related to dc sputtering, are described in great detail in my earlier U.S. patent application Ser. No. 08/261,988, filed Jun. 17, 1994, and having a common assignee herewith.

Sputtering is a vacuum deposition process in which a sputtering target is bombarded with ions, typically an ionized noble gas, and the atoms of the target material are mechanically freed by momentum transfer. The target material then coats a nearby substrate.

In a reactive sputtering process a reactive gas is introduced into the deposition chamber, and the freed target material reacts with the reactive gas to form a coating material. For example, the target material can be aluminum, and oxygen can be introduced as the reactive gas to produce a coating of aluminum oxide. A carbonaceous gas, e.g. acetylene, can be used as the reactive gas to produce carbide coatings such as SiC, WC, etc., and $N_2$ can be introduced to produce a nitride coating such as TiN. In any event, the conductive target atoms and the reactive gas react in plasma in the chamber to produce the compound that serves as a coating. In a typical example, aluminum atoms freed from an aluminum target enter a plasma of argon and oxygen to produce a deposition of aluminum oxide.

DC sputtering is a random process and the insulating coating material is deposited on all available surfaces. This means that not only does the insulating material coat the article in question, but it also coats other surfaces in the chamber as well, including the target. Thus, in a reactive sputtering process for depositing aluminum oxide, molecules of $Al_2O_3$ land on the surface of the aluminum target. This deposition of an insulator on the target causes severe problems, including a reduction of sputtering rate and a propensity to induce arcing.

Contamination of the target can also result, even in conventional dc sputtering, due to atmospheric gases, water droplets, inclusions, and other contaminants. Each of these can be a source for arcing, and their presence will also reduce the deposition rate over time because of a reduced active sputtering area on the target. Accordingly, these problems necessitate a frequent cleaning of the target surface.

This problem has been known to exist for some time, but its causes have not been completely appreciated. Procedures to deal with these problems such as arc control in active sputtering have not been completely satisfactory.

A standard approach involves sensing the presence of arcing, and then interrupting current flow. This will control the arcing, but does nothing about the insulating coating that continues to cover the target.

One early attempt to deal with arcing in a blind fashion involves periodically interrupting the current flow between the dc power supply and the plasma generator in which the sputtering occurs. Here, shutting off the dc power serves to extinguish early arcing. This means that unipolar pulses of power at a fixed duty cycle are fed to the target. This does have the beneficial effect of permitting charge to build up only partially across the dielectric deposition on the target, so that arcing is less likely to occur, and also can lead to a small amount of resputtering of the deposition. However, this system, while slowing down the rate of insulating deposit on the target, does not reverse the deposition.

Another system previously proposed is called a low energy small package arc repression circuit. In that system, an electronic switch cycles at a rate of about 2 KHz to cut off the current to the target. This in effect reverses the voltage on the target to several volts positive, and draws some electrons from the plasma to the from surface of the insulative deposition. This neutralizes the anions on the front surface of the deposition, to discharge the voltage buildup across the layer, thereby greatly reducing the occurrence of dielectric breakdown and arcing. Also, discharge of the front surface of the insulative layer lowers the surface potential to approximately that of the target. Discharging of the dielectric deposition also permits the argon ions in the plasma to collide with the insulating dielectric material. This does result in some resputtering of the molecules of the deposited material, thus slowing the rate of deposit on the target. However, this approach does not resputter the molecules of the deposited compound as effectively as the atoms of the target material, and so this approach has not been totally effective in removing deposits from the target during reactive sputtering processes.

Different materials require different voltages to be applied to the targets to effect sputtering. For example, because a gold atom is a much heavier atom than an aluminum atom, it requires a much more energetic ion to free it from the target. Typically, in a process that employs an aluminum target, the applied voltage needed is about −450 volts, while in a similar process that employs a gold target the applied voltage has to be about −700 volts.

Considering that an aluminum oxide ($Al_2O_3$) molecule is significantly heavier than an aluminum atom, one can understand that a higher potential would be required to energize the argon ion enough to resputter the coating. This is, of course, true for other materials as well.

Another approach to solve this problem involves a pair of sputtering targets, with one serving as cathode and the other as the anode. The applied electrical voltage is periodically reversed so that the sputtering occurs first from the one target and then from the other. This process also reverses the charge on the deposited insulating material as well, which reduces the possibility of arcing and also resputters some of the insulating material on the targets. However, this arrangement, requiring plural targets, can be cumbersome and expensive to employ. Moreover, this arrangement suffers from a low deposition rate due to the amount of time needed for crossover.

These previous solutions, which employ unipolar pulsing or alternately cycled targets, have been somewhat effective in reducing voltage stress on insulating films redeposited on the targets, but have not been completely effective in removing the redeposit or in preventing it. None of these approaches sputters off the insulator from the beginning before it has a chance to accumulate, and none of these techniques has been effective in eliminating or halting the redeposition of insulating film on the target, while maintaining a high deposition rate.

In the process disclosed in my earlier patent application Ser. No. 08/261,988, reactive dc sputtering is carried out in a plasma chamber by applying an electric potential to a conductive target so that target material is sputtered from the target and is reacted with a reactive gas that is introduced into the chamber. A dc voltage of a suitable level, e.g., −500 volts, is applied from a power supply to the sputtering target, which serves as cathode, with a conductive surface in the plasma chamber being held at ground to serve as anode. A noble gas, e.g., argon, present in the chamber is ionized and creates a plasma, e.g., argon anions and free electrons. The electrons are drawn off in the anode, and the positive argon ions are accelerated towards the cathode, that is, towards the conductive target. The argon ions knock atoms of target material free from the target by momentum transfer. The argon ions pick up electrons from the negatively charged target, and migrate back to the plasma. The freed target atoms enter the plasma and react with a reactive gas that has been introduced into the chamber. The reactive gas can be, for example, oxygen, nitrogen, borane, acetylene, ammonia, silane, arsene, or various other gases. The reaction product is deposited on a substrate positioned adjacent the plasma. The substrate can be a masked semiconductor wafer on which a compound such as a $Al_2O_3$, $SiO_2$, or another insulator or dielectric is to be deposited. In some processes, the substrate can be a drill bit, wear plate, valve spindle, or other mechanical part on which a wear resistant coating, such as WC or TiN, is deposited.

Non-reactive sputtering can be used to deposit a conductive layer onto the master in a compact disk fabrication process, to permit subsequent electroplating.

As mentioned before, the reaction product of the reactive sputtering process is deposited randomly, and not only coats the workpiece substrate, but also coats other surfaces including walls of the chamber and the sputtering target. Accumulation of the insulating coating can induce arcing, and also reduces the available area of the sputtering target, thereby reducing the sputtering rate over time.

In the process described in my earlier patent application Ser. No. 08/261,988, the dc power that is applied to the target is interrupted periodically by reverse-bias pulses of a dc voltage level that is positive relative to the anode. Preferably, the reverse bias pulses are at a level of 50 to 300 volts above ground potential, and these are applied at a pulse frequency of 40 KHz to 250 KHz with a pulse width of 1 µsec to 3 µsec. This results in low duty cycle pulses (about 10% or less). The reverse bias creates a reversal of the charge across the insulating material. These accumulations behave as a capacitor, with the conductive target being one plate and the conductive plasma being the other plate. The reverse voltage is applied long enough (e.g. 2 µsec) for the polarity of the capacitive charge to be reversed, up to −300 volts, on the plasma side of the deposition.

Then when the normal or negative sputtering voltage is again applied, the argon ions in the plasma are accelerated preferably towards the reverse-charged dielectric material. These ions are accelerated to an increased energy due to the additional potential difference. As a result, the molecules of the deposition are re-sputtered off the target. This process also permits the active sputtering surface area of the target to remain as large as possible.

This preferential sputtering process also cleans out other insulative contaminants from the surface of the target whether used for reactive sputtering or conventional sputtering.

Although the aforedescribed preferential sputtering process has largely achieved favorable results in the field of pulsed dc power, additional problems can arise that this technique does not resolve. For example, particulates and arc damage to the surface of the target can give rise to mechanical arcs, that is, persistent arcing problems that do not clear themselves immediately when the reverse bias is applied. Also, an extreme voltage condition can exist, for example if there is too little gas present to support a plasma. In most cases an arcing or an overvoltage condition will clear itself in a single cycle of the applied pulsed voltage. However, where the reverse bias voltage does not clear the problem, some additional steps need to be taken to prevent damage either to the workpiece, the plasma cell, or the power supply. Unfortunately, no present system is capable of operating in conjunction with the reverse bias pulsed power supply and of detecting and reacting to either a persistent arc (sticky arc or multistrike arc) or an overvoltage condition.

OBJECTS AND SUMMARY OF THE INVENTION

It is an object of this invention to enhance sputtering or other plasma chamber operation in a fashion which detects and deals with arcing or overvoltage condition, and which avoids the problems of the prior art.

It is another object to carry out a sputtering operation under conditions that detects mechanical arcing and overvoltage conditions, and which automatically takes steps to terminate such conditions.

It is a further object to prevent mechanical arcing and overvoltage from damaging components of the plasma power supply.

According to an aspect of the present invention, a pulsed dc sputtering process is carried out by sputtering target material from a conductive target in a plasma chamber. A dc voltage is applied between the target and an anode in the plasma chamber, causing noble gas ions present in the chamber to impinge on the target. The noble gas ions sputter away atoms of the target material. The dc power supply applies a pulse waveform to the target at a predetermined rate. Each cycle of the pulse waveform includes a negative voltage pulse portion at a predetermined negative voltage level, e.g. −300 to −700 volts, and first pulse width, and a positive voltage level relative to the anode, e.g., +50 to +300 volts, and at a predetermined second pulse width.

An overvoltage sensing circuit, which can comprise a stack or string of zener diodes, detects when the applied voltage exceeds a predetermined negative voltage level. Normally, an overvoltage condition will clear itself in one cycle by action of the reverse bias pulse. However, if the overvoltage condition persists for two successive cycles, the voltage supply will be interrupted for some predetermined time period. The string of zener diodes also clamps any voltage overshoots to a maximum level to protect switching transistors in the power supply.

The applied voltage is also continuously monitored for a mechanical arcing condition. To do this the applied voltage is interrogated during a window period at approximately 80 percent of the pulse width of the negative pulse portion of each cycle. Typically, a plasma will produce a voltage drop of several hundred volts, whereas the voltage drop is very small when arcing occurs, typically a few volts to twenty volts or so. Accordingly, during the window period the applied voltage is monitored to determine if the voltage is in a low voltage range that is characteristic of arcing. If the low voltage condition is present for two cycles in succession, then the dc power supply is interrupted for some period of time, from a few microseconds to a few milliseconds, to clear the arc.

Alternatively, the interruption can be initiated when an overvoltage or arcing condition is present for one cycle, three cycles, or some other number of cycles in succession.

When this technique is used, the sputtering process avoids the problems associated with arcing, such as arc damage to the substrate and particulates in the sputtered coating. The technique also prevents damage to the plasma chamber and to the power supply and pulser unit. The same element both detects the overvoltage condition and clamps any overvoltage to protect the equipment. The improvement of this invention detects and deals with the various types of occurrences to improve the quality level of the coating on the substrate.

The above and many other objects, features, and advantages of this invention will become apparent from the ensuing description of a preferred embodiment, which should be read in conjunction with the accompanying Drawing.

DETAILED DESCRIPTION OF THE PREFERRED EMBODIMENT

Figure 1:
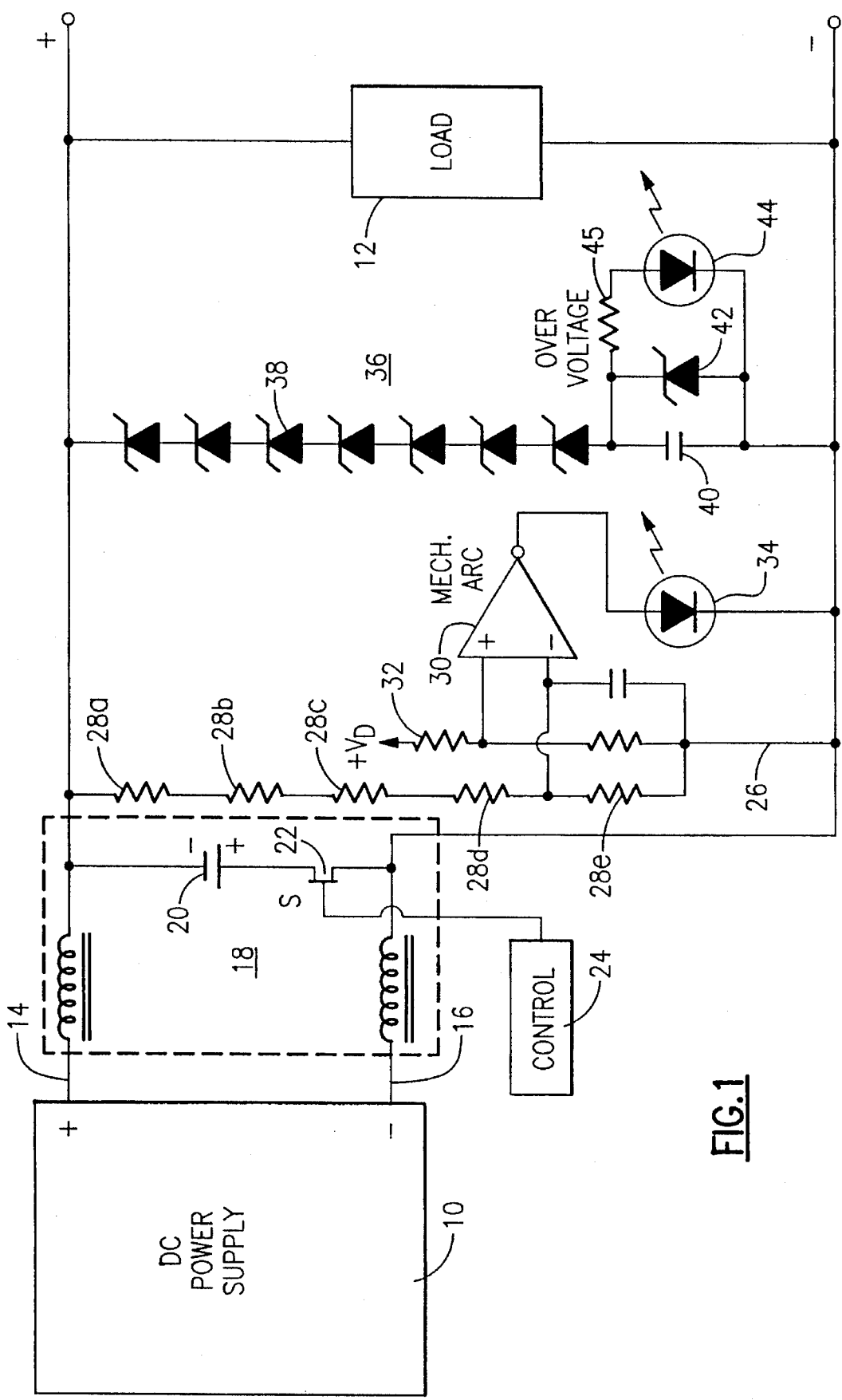
FIG. 1 is a circuit schematic of a sputtering power supply with mechanical arc and overvoltage detection according to an embodiment of this invention.

With reference to the Drawing, and initially to FIG. 1, a pulsed dc sputtering arrangement employs a dc plasma power supply 10 to feed dc power to a plasma chamber load 12. Plasma chambers of this type are well known, and the same are described in detail for example in my earlier U.S. patent application. Ser. No. 08/261,988, entitled Preferential Sputtering of Insulators from Conductive Targets, filed Jun. 17, 1994, and which is incorporated herein by reference. In this example, the dc supply has a positive terminal 14 and a negative terminal 16, supplying power at a selected dc voltage; e.g., between 300 volts and 700 volts. Associated with the power source 10 is a reversing pulse generator 18, here shown to include a reverse bias source 20, an FET 22 serving as a switch, and a control circuit 24 for actuating the switch FET 22. The operation of this reversing pulse generator is also described in the above-mentioned patent application.

A mechanical arc detection circuit 26 is connected to the input of the plasma chamber load 12 to detect a voltage condition that is characteristic of arcing. That is, under plasma conditions, the voltage drop across the plasma will be on the order of several hundred volts. However, an arcing condition appears as a short circuit across the plasma, and exhibits a voltage drop of from several volts to about 100 volts. To detect a low voltage condition, the circuit includes a string of resistors 28a to 28e serving as a voltage divider 28, and is coupled to one input of a voltage comparator 30, whose other input is connected to a reference voltage source 32, here a voltage divider. An output of the comparator 30 is supplied to an opto transmitter device 34, here represented as an LED.

An overvoltage detection and clamping circuit 36, also connected to the input of the plasma chamber load 12, includes a string of zener diodes 38 in series, the string being connected at one end to the positive dc power and at the other end to an overvoltage opto transmitter, here represented as an LED 44, a capacitor 40, a protective voltage-limiting zener diode 42 and a resistor 45. The zener diodes 38 are selected so that the sum of their reverse breakdown voltages equals a predetermined overvoltage threshold. Alternative voltage limiting technology could be employed in lieu of the zener diodes, e.g., MOVs. The capacitor 40, zener diode 42 and LED 44 connect to negative dc (−rail), which serves as a current sink for any extreme voltage excursions. Whenever the voltage at the input to the load 12 exceeds this threshold, current will flow through the string 38 and through the LED 44 to signal an overvoltage condition. Also, the zener diode string 38 clamps any voltage spikes to this overvoltage threshold, and thus protects the pulser 18 and power supply 10, as well as the plasma chamber and the substrate therein that is to be coated.

Figure 2:
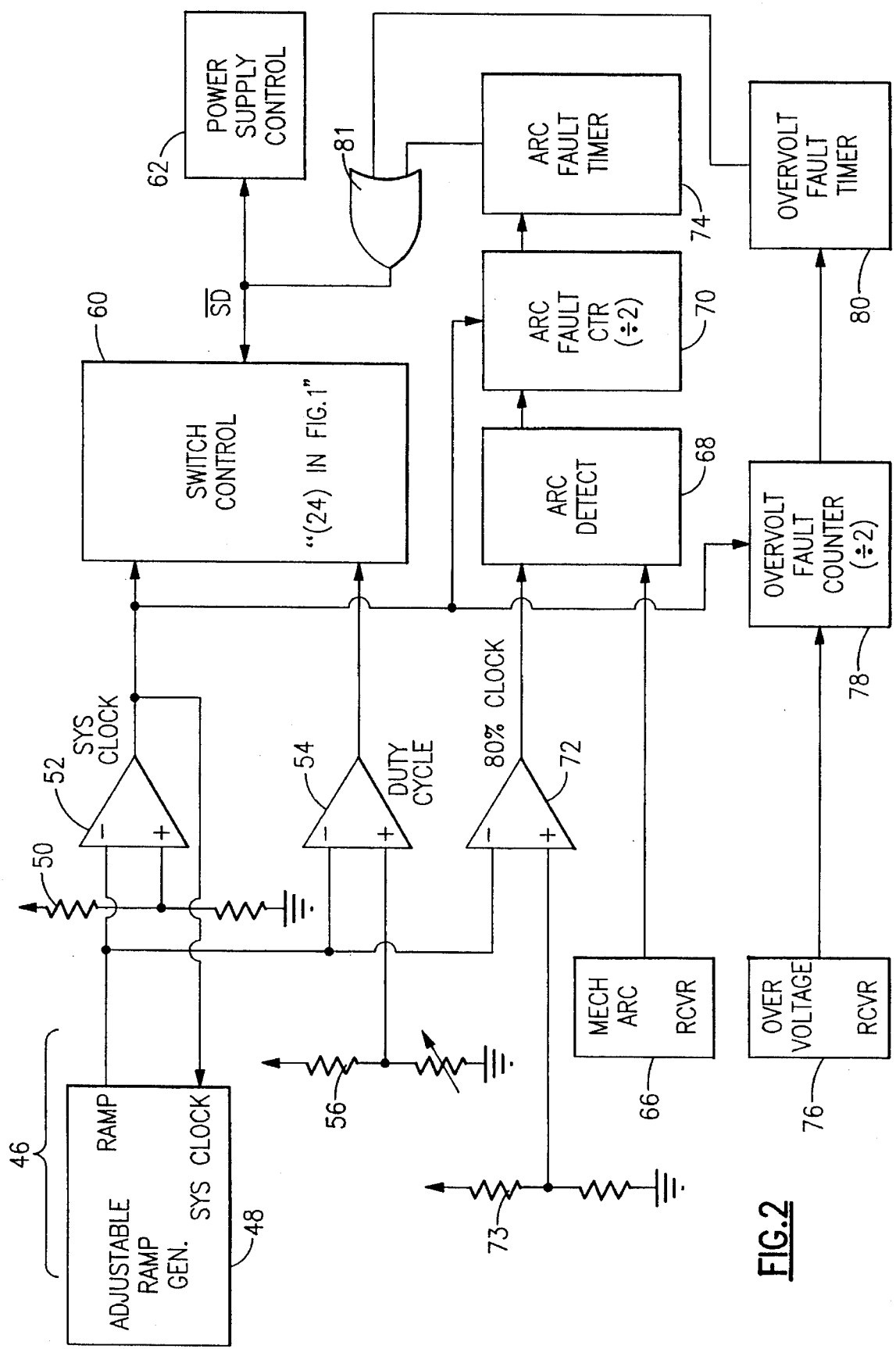
FIG. 2 is a circuit schematic of control circuitry of this embodiment for interrupting the power supply under detected conditions of mechanical arcing or overvoltage.
Figure 3A:
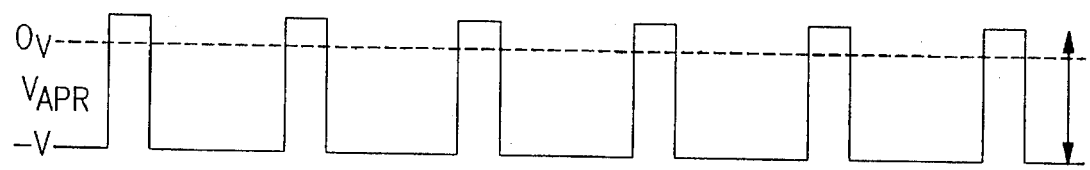
FIGS. 3A to 3E are wave charts for explaining the operation of this embodiment.

The control circuit 24 for the pulsed dc power supply is shown in more detail in FIG. 2. A system clock circuit 46 comprises an adjustable voltage ramp source or generator 48, a reference voltage source 50 and a comparator 52 whose output generates a clock signal SYS CLOCK. The ramp signal from the ramp generator 48 is fed to an input of a duty cycle comparator 54, whose other input is coupled to a reference voltage divider 56. The output of this comparator 54 provides a pulse signal DUTY CYCLE that governs the pulse widths of the positive and negative portions of the pulsed dc power cycle. The ramp generator 48 and the reference voltage divider 56 are shown here as implemented with conventional (analog) components, but it is to be understood that these could be digitally implemented and adjusted by means of software. The pulse signals SYS CLOCK and DUTY CYCLE are supplied to inputs of a switch control circuit 60 or pulser. This generates a pulse signal that is applied to a power supply control circuit 62 and defines the positive and negative pulse portions of the pulsed dc power, as shown e.g., in FIG. 3A. The control circuit 24 supplies controlled gating voltage to the switch transistor 22 (FIG. 1).

The circuitry responsive to a mechanical arcing is also shown in FIG. 2. Here, a mechanical arc receiver 66 includes a photo sensor that is optically coupled to the opto transmitter 34, and in practice the two elements can be packaged together as an opto-isolator device. An output of the receiver 66 goes to one input of an arc detect circuit 68. A timing comparator 72 is supplied with the signal RAMP and a reference level e.g. from voltage divider 73. The comparator 72 is biased to provide a gating window pulse 80% CLOCK when a predetermined portion of the negative pulse portion (e.g., 80 percent) of the pulsed dc power cycle has elapsed. The gating window pulse 80% CLOCK is fed to another input of the arc detect circuit 68. The output of the arc detect circuit 68 goes high if, during occurrences of the gating window interval, the applied voltage appearing at the plasma chamber load 12 is less negative than the predetermined negative threshold. The arc detect output is applied to an arc fault counter circuit 70. The clock signal SYS CLOCK is applied to a clock input of the counter circuit 70. If the arc detect output remains high for two cycles in a row, then a signal is supplied to a timer circuit 74. The latter is actuated when the output of the arc fault counter 70 is high, and this produces an inhibit signal SD that is fed to the switch control circuit 60 and the power supply control circuit 62. The effect of this is to interrupt the pulsed dc power for a period of time, such as 200 microseconds, when arcing is detected in two successive cycles of the applied power. This can be explained with reference to FIGS. 3B and 3D.

Figure 3B:
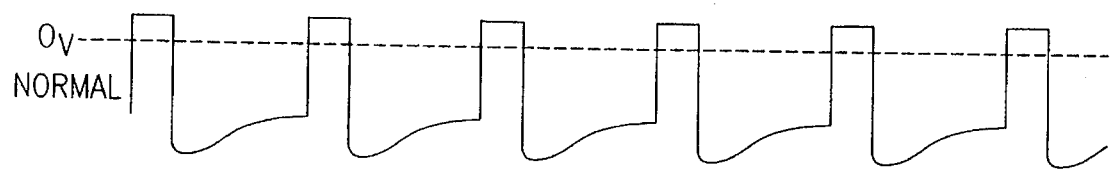

As shown in FIG. 3B, during normal, stable conditions for each negative-going pulse portion, the applied voltage exhibits a negative overshoot, and then a rise until the next successive reverse bias (positive) pulse. In this case, the negative pulse portion always exceeds a few hundred volts, which is typical of a plasma condition. However, if arcing should occur, the voltage levels exhibited during the negative pulse portion of the applied would be much smaller. In effect an arc occurring in the plasma chamber 12 would act as a low impedance or short circuit, and would present a small voltage drop across the chamber 12.

Figure 3C:
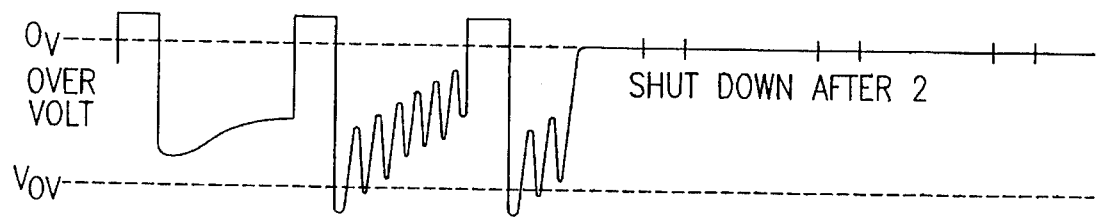
Figure 3D:
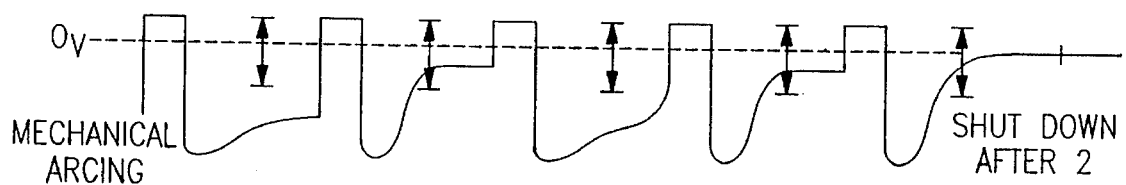
Figure 3E:

Referring now also to FIGS. 3D and 3E, the mechanical arc detecting circuit 34, the receiver 66, and the associated logic and timing circuitry 68 to 74 sample the applied power (FIG. 3D) during appearances of the gating window pulses 80% CLOCK (FIG. 3E). If the applied voltage at this time is within a range that is characteristic of arcing, that is less negative than a threshold voltage $-V_{arc}$, then the opto transmitter 34 lights, and communicates optically with the receiver 66. If this occurs for a single cycle only, then the pulsed dc power continues normally. In most instances, the reverse bias pulses will clear any problem, and there is no need to interrupt the applied power to the plasma chamber. This is represented by the second and third cycles shown in FIG. 3D. If there is only a single instance of arcing, then the arc fault counter 70 resets, and the output remains low. The threshold voltage $-V_{arc}$ can be, e.g., 50 volts, 100 volts, or other suitable value.

However, if arcing is present during the pulse 80% CLOCK for two cycles in succession, as indicated in the fourth and fifth cycles illustrated in FIG. 3D, are fault counter 70 outputs a high level. This actuates the timer circuit 74, inhibiting the control circuit 60 and supply control circuit 62 (e.g., 24, FIG. 1). This action effectively shuts down the applied power for a predetermined period (preferably, a few hundred microseconds) and applies reverse bias for this period to rapidly kill the arc. Thereafter, the normal pulsed dc power can resume and be applied to the plasma chamber.

In this embodiment, the dc power is shut off when there is arcing in two cycles in a row. If preferred, the circuit could be arranged to require arcing over one cycle, three cycles in succession, three cycles out of five, or some other scheme.

Returning to FIG. 2, an overvoltage reviver 76 is optically coupled to the overvoltage transmitter LED 44. An output of the receiver 76 is tied to one input of an overvoltage fault counter circuit 78, and the clock signal SYS CLOCK is applied to a clock input thereof. The output of the overvoltage fault counter 78 is coupled to an input of an overvoltage fault timer circuit 80, the latter providing an interrupt signal through a gate 81 to the switch control circuit 60 (e.g., 24, FIG. 1) and the supply circuit 62 whenever an overvoltage condition is present for two cycles in succession of the applied power. The timer circuit interrupt signal can have a typical duration of 200 microseconds. In this embodiment, the overvoltage fault counter goes high if it receives an over voltage signal from the overvoltage receiver 76 after each of two successive occurrences of the clock signal SYS CLOCK, but will remain low under all other conditions.

Operation of the overvoltage detection and protection arrangement can be explained with reference to FIG. 3C. As mentioned previously, there is a negative voltage overshoot exhibited at the beginning of the negative voltage pulse portion for each cycle of the applied voltage. This is shown in the first cycle in FIG. 3C and is also shown in like manner in FIG. 3B. The applied voltage can be in the range of about minus 50 to minus 4000 volts, depending on the operating conditions and the plasma process involved, and the permissible overshoot can be a large fraction of this. However, under some conditions, the plasma may cease to be present or may behave abnormally, and the plasma chamber load 12 may present an infinite impedance. This can create a ringing condition. In that case, as shown in the second and third cycles in FIG. 3C, voltage excursions well beyond the permissible range may occur. In this case, the zener string 38 can be selected to have an overvoltage threshold $V_{OV}$ on the order of a thousand to a few thousand volts. When the applied voltage appearing across the load 12 exceeds this threshold $V_{OV}$ the overvoltage transmitter 34 becomes lit, and the overvoltage receiver 76 sends a high level to the overvoltage fault counter 78. If an overvoltage condition is present for only a single cycle, the control circuit 60 (24, FIG. 1) continues to switch normally, and in most instances, the overvoltage problem will clear itself. However, if the overvoltage condition is present for two cycles in succession, then the timer 80 communicates an inhibit command $\overline{SD}$ to both the switch control circuit 60 (24, FIG. 1) and the supply control 62, and the applied power is interrupted for the predetermined time mentioned just above. Alternatively, the power could be interrupted and reverse bias applied for the time out period. Here again, in this embodiment the power will be shut off if an overvoltage condition is present for two cycles in a row, and the pulser will also be held off. In other possible embodiments, other schemes could be used, such as one cycle, three cycles in a row, or three cycles out of five.

Here again as with the mechanical arcing detection and protection, after the interrupt period as determined by the timer circuit 80, the control circuit 24 (e.g., 60, FIG. 2) resumes normal operations, and awaits the occurrence of two successive cycles with overvoltage excursions or two successive cycles with arcing.

While the invention has been described here with reference to a preferred embodiment, it should be understood that the invention is not limited to that precise embodiment. Rather, many modifications and variations would present themselves to persons skilled in the art without departure from the scope and spirit of the invention, as defined in the appended claims.

I claim:

1. A pulsed dc sputtering process wherein a target material is sputtered from a conductive target in a plasma chamber and the sputtered material is deposited on a substrate in the chamber, comprising the steps of applying a dc voltage between said target and an anode in said chamber at a level that causes noble gas ions present in said chamber to impinge on the target to sputter away atoms of said target material, including applying a pulse waveform to said target at a predetermined rate, each cycle of which includes a negative voltage portion at a predetermined negative level relative to said anode and a predetermined first pulse width, and a positive voltage level relative to said anode and a predetermined second pulse width;

sensing the applied voltage between said target and anode for overvoltage, and if said applied voltage exceeds a predetermined negative overvoltage threshold during said negative voltage portion over a predetermined plurality of successive cycles, then automatically interrupting said dc voltage; and sensing the applied voltage between said target and anode for arcing at a predetermined window interval during each said negative pulse portion, and if said applied voltage is in a range of voltages characteristic of arcing in said window interval over a predetermined plurality of successive cycles, then automatically interrupting said dc voltage.

2. The pulsed dc sputtering process according to claim 1, wherein said step of sensing the applied voltage for overvoltage includes clamping said applied voltage at said overvoltage threshold when said applied voltage reaches or exceeds said threshold.

3. The pulsed dc sputtering process according to claim 1, wherein for said step of sensing the applied voltage for overvoltage, said predetermined plurality of cycles is two cycles in succession.

4. The pulsed dc sputtering process according to claim 1, wherein for said step of sensing the applied voltage for arcing, said predetermined plurality of cycles is two cycles in succession.

5. A dc plasma arrangement for dc sputtering wherein a plasma chamber houses an anode, means for mounting a substrate, and a target, and target material is sputtered from said target and is deposited on a said substrate, comprising a pulsed dc power supply applying to said target a negative voltage at a predetermined level that causes a plasma of noble gas ions in said chamber to impinge upon said target with sufficient energy to free said target material from said target such that the target material deposits itself on the substrate, including periodic reverse biasing means for applying said negative voltage to said target at said predetermined level for pulse intervals of a predetermined pulse duration and applying pulses of a positive voltage to said target relative to said anode between the occurrences of said negative voltage so that adjacent pulses of said negative voltage and said positive voltage define a cycle having a predetermined rate;

overvoltage protection means for sensing the applied voltage between said target and anode and if said applied voltage exceeds a predetermined negative overvoltage threshold during said negative voltage portion over a predetermined plurality of successive cycles, then automatically interrupting said dc voltage; and arc elimination means for sensing the applied voltage between said target and anode for arcing at a predetermined window interval during each said negative pulse portion, and if said applied voltage is in a range of voltages characteristic of arcing in said window interval over a predetermined plurality of successive cycles, then automatically interrupting said dc voltage and applying a reverse bias voltage to said target for an extended period.

6. The dc plasma arrangement according to claim 5, wherein said overvoltage protection means includes clamping means for clamping said applied voltage at said overvoltage threshold when said applied voltage reaches or exceeds said threshold.

7. The dc plasma arrangement according to claim 6, wherein said overvoltage protection means includes a series stack of zener diodes connected between the output terminals of said pulsed dc power supply.

8. The dc plasma arrangement according to claim 7, wherein said overvoltage protection means includes an opto transmitter coupled between said stack of zener diodes and a current sink, an opto receiver optically coupled to said transmitter, and circuit means actuated by said opto receiver to interrupt said dc power supply when said opto receiver indicates an overvoltage for said plurality of successive cycles.

9. The dc plasma arrangement according to claim 5, wherein said arc elimination means includes a voltage comparator having an output and inputs coupled to an output of said dc power supply and to a reference voltage source, an opto transmitter driven by the output of said comparator, an opto receiver optically coupled to said transmitter, window timer means for generating a window signal during the predetermined window interval of each said negative pulse portion of each cycle, logic means coupled to said opto receiver and said window timer means for detecting whether said characteristic voltage is present during said window interval for said predetermined plurality of cycles, and interrupter means coupled to said logic means for interrupting said dc power supply when said characteristic voltage is present during said window interval for said predetermined plurality of cycles.

* * * * *